(12) United States Patent
Schwenk et al.

(10) Patent No.: US 12,094,717 B2
(45) Date of Patent: Sep. 17, 2024

(54) METHOD FOR FORMING A TRENCH IN A FIRST SEMICONDUCTOR LAYER OF A MULTI-LAYER SYSTEM

(71) Applicant: Robert Bosch GmbH, Stuttgart (DE)

(72) Inventors: Christof Schwenk, Stuttgart (DE); Nicolas Schorr, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 460 days.

(21) Appl. No.: 17/573,708

(22) Filed: Jan. 12, 2022

(65) Prior Publication Data
US 2022/0230886 A1    Jul. 21, 2022

(30) Foreign Application Priority Data
Jan. 19, 2021   (DE) .................... 10 2021 200 431.8

(51) Int. Cl.
*H01L 21/308*   (2006.01)
*B81C 1/00*   (2006.01)
(Continued)

(52) U.S. Cl.
CPC ........ *H01L 21/308* (2013.01); *B81C 1/00063* (2013.01); *B81C 1/00103* (2013.01);
(Continued)

(58) Field of Classification Search
CPC ........... H01L 21/3065; H01L 21/30655; H01L 21/308; H01L 21/31116; H01L 22/26;
(Continued)

(56) References Cited

U.S. PATENT DOCUMENTS

| 5,501,893 A * | 3/1996 | Laermer | B81C 1/00619 |
| | | | 428/161 |
| 7,022,617 B2 * | 4/2006 | Subramanian | B81C 1/00071 |
| | | | 438/719 |

(Continued)

FOREIGN PATENT DOCUMENTS

| DE | 19937501 A1 * | 3/2001 | ....... H01L 21/30655 |
| DE | 10243010 A1 * | 3/2004 | ......... B81C 1/00611 |

(Continued)

*Primary Examiner* — Maliheh Malek
(74) *Attorney, Agent, or Firm* — NORTON ROSE FULBRIGHT US LLP; Gerard A. Messina (57) ABSTRACT

A method for forming a trench in a first semiconductor layer of a multi-layer system. The method includes: applying a mask layer onto the first semiconductor layer, a recess being formed in the mask layer so that the first semiconductor layer is exposed within the recess; applying a protective layer which completely covers or modifies the first semiconductor layer exposed within the recess; applying a second semiconductor layer; etching the second semiconductor layer to completely remove it in a subarea surrounding the recess of the mask layer; etching the protective layer so that the first semiconductor layer is exposed within the recess; and forming the trench in the first semiconductor layer, the recess of the mask layer serving as an etching mask, and the trench being formed by a cyclical alternation between etching and passivation steps, the first etching step being longer than the subsequent etching steps.

10 Claims, 8 Drawing Sheets

(51) Int. Cl.
*H01L 21/3065* (2006.01)
*H01L 21/311* (2006.01)
*H01L 21/66* (2006.01)
*H01L 21/762* (2006.01)

(52) U.S. Cl.
CPC .... *H01L 21/3065* (2013.01); *H01L 21/30655* (2013.01); *H01L 21/31116* (2013.01); *H01L 21/76205* (2013.01); *H01L 21/76235* (2013.01); *H01L 22/26* (2013.01)

(58) Field of Classification Search
CPC ............. H01L 21/3083; H01L 21/3086; B81C 1/00428; B81C 2201/0198; B81C 1/00388; B81C 1/00523; B81C 1/00531; B81C 2201/0112; B81B 2203/033
See application file for complete search history.

(56) References Cited

U.S. PATENT DOCUMENTS

| | | | | |
|---|---|---|---|---|
| 7,141,504 B1* | 11/2006 | Bhardwaj | ............... | C07C 17/00 438/719 |
| 7,354,786 B2* | 4/2008 | Benzel | ............... | B81C 1/00182 438/243 |
| 7,544,620 B2* | 6/2009 | Colombo | .......... | H01L 21/30655 438/689 |
| 7,888,234 B2* | 2/2011 | Knaipp | ............. | H01L 21/76205 438/432 |
| 8,461,052 B2* | 6/2013 | Oohara | ............. | H01L 21/30655 438/719 |
| 8,652,969 B2* | 2/2014 | Fuller | ............... | H01L 21/30655 438/703 |
| 8,928,124 B2* | 1/2015 | Fuller | ............... | H01L 21/76898 257/622 |
| 9,006,109 B2* | 4/2015 | Engelhardt | ....... | H01L 21/30655 438/689 |
| 9,041,163 B2* | 5/2015 | Chen | ................ | H01L 21/76898 257/621 |
| 9,299,576 B2* | 3/2016 | Oda | ................. | H01L 21/30655 |
| 9,443,790 B2* | 9/2016 | Fujita | ............. | H01L 21/823481 |
| 9,586,207 B2* | 3/2017 | Mermoz | ................. | B01L 3/561 |
| 11,130,672 B2* | 9/2021 | Baader | ................. | B81B 7/0058 |
| 11,830,948 B2* | 11/2023 | Kuo | .................. | H01L 21/3065 |
| 2003/0052088 A1* | 3/2003 | Khan | ............... | H01L 29/66181 438/719 |
| 2004/0053501 A1* | 3/2004 | Brennan | ............. | H01L 23/5226 257/E23.145 |
| 2004/0198064 A1* | 10/2004 | Subramanian | ...... | B81C 1/00111 438/719 |
| 2006/0057816 A1* | 3/2006 | Benzel | ................ | G01P 15/0802 438/424 |
| 2006/0292877 A1* | 12/2006 | Lake | .................... | H01L 23/481 438/719 |
| 2007/0190743 A1* | 8/2007 | Colombo | .......... | H01L 21/76283 438/424 |
| 2008/0290445 A1* | 11/2008 | Knaipp | ............. | H01L 21/76235 438/432 |
| 2011/0008959 A1* | 1/2011 | Morgan | ........... | H01L 21/30655 257/734 |
| 2011/0207323 A1* | 8/2011 | Ditizio | .............. | H01L 21/02271 257/E21.597 |
| 2011/0244687 A1* | 10/2011 | Oohara | ................. | H01J 37/321 438/694 |
| 2011/0298140 A1* | 12/2011 | Reinmuth | ........... | B81C 1/00301 257/774 |
| 2012/0129278 A1* | 5/2012 | Yoshii | ................. | B81C 1/00087 257/E21.529 |
| 2012/0299099 A1* | 11/2012 | Huang | ................ | H01L 29/0653 257/E21.294 |
| 2013/0105947 A1* | 5/2013 | Fuller | ............... | H01L 21/30655 257/E21.585 |
| 2014/0291779 A1* | 10/2014 | Engelhardt | ......... | B81C 1/00531 438/703 |
| 2015/0104927 A1* | 4/2015 | Chen | .................. | H01L 21/8221 438/459 |
| 2015/0140717 A1* | 5/2015 | Urban | ................. | B81C 1/00531 156/345.1 |
| 2016/0144365 A1* | 5/2016 | Mermoz | ................. | B01L 3/502 422/547 |
| 2019/0244827 A1* | 8/2019 | Wieland | ............... | H01J 37/3244 |
| 2020/0168463 A1* | 5/2020 | Ko | ....................... | H01L 21/3081 |
| 2020/0361765 A1* | 11/2020 | Baader | ..................... | B81B 7/02 |
| 2021/0257497 A1* | 8/2021 | Kuo | .......... | H01L 29/7853 |
| 2023/0009146 A1* | 1/2023 | Jo | ............ | H01L 28/84 |
| 2024/0021499 A1* | 1/2024 | Liu | ................... | H01L 21/30655 |
| 2024/0063025 A1* | 2/2024 | Hong | ......... | H01L 21/0332 |

FOREIGN PATENT DOCUMENTS

| | | | | |
|---|---|---|---|---|
| DE | 10333995 B4 | * | 10/2018 | ........ B81C 1/00531 |
| DE | 102017213631 A1 | * | 2/2019 | ............. B81B 1/00 |
| DE | 102021200431 A1 | * | 7/2022 | ........ H01L 21/3065 |
| EP | 3665122 B1 | * | 5/2023 | ............... B81B 1/00 |
| KR | 20200033956 A | * | 3/2020 | ......... B81B 7/0058 |
| WO | WO-2004026760 A2 | * | 4/2004 | ........ B81C 1/00611 |
| WO | WO-2019030040 A1 | * | 2/2019 | ............... B81B 1/00 |

* cited by examiner

METHOD FOR FORMING A TRENCH IN A FIRST SEMICONDUCTOR LAYER OF A MULTI-LAYER SYSTEM

FIELD

The present invention is directed to a method for forming a trench in a first semiconductor layer of a multi-layer system.

BACKGROUND INFORMATION

Conventional methods for structuring semiconductor layers with the aid of trench etching (trenching) from the related art are available in numerous specific embodiments. For example, structures which, provided with corresponding electrical contacting, may act as movable masses are exposed by one or multiple trench(es) during the manufacture of microelectromechanical systems (MEMS). For this purpose, the MEMS functional trench using deep reactive ion etching (DRIE) is described, in particular, in U.S. Pat. No. 5,501,893 A ("Method of anisotropically etching silicon"), in which a trench including almost perfectly vertically extending inner walls may be formed in a semiconductor layer via a cyclical sequence of etching and passivation steps. In the process, however, the material removal progresses slightly more slowly directly beneath the layer serving as the etching mask (hard mask) so that less material is removed there than in the deeper sections. As a result of this lesser removal, a slight overhang ("blade") remains after removal of the mask at the upper edge of the trench, which may be subject to mechanical striking and may break off after the release of the movable structures, so that broken-off semiconductor particles or hooking of the freely movable structure may arise. To avoid the formation of this "blade," an extended etching cycle is carried out at the beginning of the trench etching process so that a pronounced "first groove" is generated in the trench wall directly beneath the mask, and a protrusion of material is accordingly prevented.

For some applications, however, a buried hard mask is required, i.e., initially, a second semiconductor layer is deposited onto the mask layer, which is then partially removed again in a subsequent etching process. If the removal of the second semiconductor layer (situated above the hard mask) and the trench formation in the first semiconductor layer (situated beneath the mask layer) are carried out in a continuous etching process, the problem arises that the "first groove" of the trench cannot be precisely positioned at the upper edge of the trench. The extended etching cycle for forming this groove must take place as exactly as possible during the transition between the first and second semiconductor layers, i.e., at the point in time at which the first semiconductor layer was exposed by removal of the second semiconductor layer. The continuous advancement of the trenching process and the variation of the layer thicknesses and etching rates across the wafer make it almost impossible to precisely establish this point in time. In other words, the etching front impinges on the upper side of the first semiconductor layer, where the desired groove is to be generated, at different points in time at different locations of the wafer. An exact prediction of when this point in time occurs is not possible due to the variances across a single wafer, the variance between different wafers, and differences in the trenching equipment.

SUMMARY

It is an object of the present invention to provide a method by which an overhang at the upper edge of the trench may be avoided when etching a layer system using a buried etching mask.

Compared to the related art, a method in accordance with an example embodiment of the present invention allows a defined "first groove" to be generated at the upper edges of trenches, in particular, also when the trenches are formed in parallel at different locations of the wafer, and the formation of the first groove must thus take place homogeneously across the entire wafer. In this way, the risk of an undesirable mechanical contacting of two adjoining "blades" at the surface of the first semiconductor layer is avoided.

The multi-layer system which is generated and structured by the method according to an example embodiment of the present invention initially includes at least one first semiconductor layer, which is situated in parallel to a substrate. Lateral directions (i.e., extending in parallel to the main extension plane) and a direction extending perpendicularly to the main extension plane, which is also referred to hereafter as the vertical direction, are established by the main extension plane of the first semiconductor layer or of the substrate. The extension of the various layers in the vertical direction are referred to as thickness, and the respective positions of the layers are denoted by the terms "above" and "beneath."

Initially, a mask layer is applied onto the first semiconductor layer and provided with at least one recess, so that the mask layer thus structured may be used as an etching mask for the later trenching process. For the sake of simplicity, the method is described hereafter based on a single recess, however, of course, the case being included that the mask layer includes a multitude of recesses by which accordingly multiple trenches may be prepared. In a directly following step, a protective layer is applied onto the mask layer in such a way that the mask layer, outside the recess, is completely covered by the protective layer, and the surface of the first semiconductor layer exposed within the recess is also completely covered by the protective layer. The protective layer may also be generated by modifications of the surface exposed within the recess, in particular, by an oxidation of the semiconductor material in such a way that the oxide layer (e.g., $SiO_2$) extends across the entire recess. Beneath the mask layer, the surface of the first semiconductor layer is partially protected against further oxidation of the surface by the mask layer itself. The oxidation could result in an oxidation of the mask layer, which must not impair the further processing. At the same time, the oxidation on its own results in a sub-surface migration of the mask layer and a retraction of the "blade." Thereafter, a second semiconductor layer, which buries the protective layer and the mask layer beneath it, is applied onto the protective layer. Then, in particular, further functional layers may be deposited above the second semiconductor layer, which thereafter are removed together with the second semiconductor layer in certain areas, but remain in other areas. In a step following the formation of the second semiconductor layer, the second semiconductor layer is then completely removed in a sub-area surrounding the recess of the mask layer. In other words, in lateral surroundings of the recess, the second semiconductor layer situated thereabove is completely removed, so that the protective layer is exposed in this area encompassing the recess. During this process, the protective layer acts as an etching stop, i.e., the etching rate of the material of the protective layer is considerably smaller than that of the second semiconductor layer, so that the etching process essentially comes to a halt, or at least drastically slows, when the protective layer is reached.

After the second semiconductor layer has been etched, the protective layer exposed thereby is removed or perforated in a controlled manner, at least in the area of the recess in the mask layer, so that the surface of the first semiconductor layer situated therebeneath is exposed. During the subsequent etching of the first semiconductor layer, the lateral shape and extension of the recess in the mask layer define the lateral geometry of the trench. The trench formation takes place by an alternating sequence of etching and passivation cycles, preferably by deep reactive ion etching (DRIE). According to the present invention, the first etching cycle after the removal of the protective layer is prolonged compared to the subsequent etching cycles, i.e., the action of the etching agent takes place over a longer time period, so that the desired "first groove" is created in the vicinity of the surface of the first semiconductor layer as a result of the increased material removal. It is also possible here that an intensification of the etching process takes place, instead of a prolongation of the action time of the etching agent, so that more material may be removed during the corresponding time period due to the greater removal rate. The removal of the second semiconductor layer, the perforation of the protective layer, and the subsequent formation of the trench in the first semiconductor layer take place, in particular, as consecutive sequences of an integrated overall process, which is preferably carried out in a trenching chamber, without interim discharge of the wafer.

The first and/or the second semiconductor layer(s) may, for example, be made up of polycrystalline silicon (polysilicon) and, in particular, a movable structure for a microelectromechanical system (MEMS) may be formed by the trenches formed in the first semiconductor layer. The second semiconductor layer is completely removed above the structure defined by the trenches, for example to expose the movable structure toward the top. In contrast, the second semiconductor layer may remain partially or completely in existence in at least one other lateral subarea. This subarea of the second semiconductor layer recessed during etching may, in particular, act as a stand-off and defines, for example, the distance between the first semiconductor layer, or the functional structures formed of this layer, and the elements situated thereabove, such as for example a cap or CMOS wafer. In the process, the stand-off may include further structured functional layers and be used, for example, for electrically contacting the structures formed in the first semiconductor layer.

Advantageous embodiments and refinements of the present invention may be derived from the description herein with reference to the figures.

According to one preferred specific embodiment of the present invention, it is provided that, after the application of the mask layer, at least one further recess is formed in the mask layer and the first semiconductor layer is exposed within the further recess, the protective layer being applied in such a way that it completely covers the first semiconductor layer exposed within the further recess, the protective layer being removed within the further recess prior to the application of the second semiconductor layer, so that the second semiconductor layer is in contact with the first semiconductor layer via the recess. Via the second recess, the first and second semiconductor layers directly adjoin one another, so that an electrically conducting connection is established between the two layers. To establish this contact via the further recess, the protective layer, which is initially applied across the entire lateral extension of the mask layer, must be removed in the area of the recess before the second semiconductor layer is deposited. The recess, which serves as a mask for the trench, is also referred to hereafter as a first recess, while the further recess, which establishes the contact between the first and second semiconductor layers, is referred to as a second recess. The pattern is not limited to only two recesses, and it is possible for multiple recesses for the formation of trenches and multiple recesses for the contacting to both be present. During the etching of the second semiconductor layer, the second semiconductor layer is removed in the lateral area of the (first) recess up to the protective layer, while it remains in existence in the area of the further (second) recess. The recess and the further recess are, in particular, spaced apart from one another in the lateral direction, i.e., are situated in different lateral areas of the mask layer. In the process, in particular, one or multiple additional functional layer(s) may be applied onto the second semiconductor layer in the lateral area which remains in existence during etching. The second semiconductor layer and/or the functional layers may be structured, and the structure thus formed may be conductively connected to the first semiconductor layer via the second semiconductor layer.

According to one specific embodiment of the method according to the present invention, a subarea of the second semiconductor layer surrounding the further recess of the mask layer is protected against material removal by a lacquer coat during the etching of the second semiconductor layer. The subarea around the further recess is protected by the lacquer coat and, in contrast to the subarea, is not removed around the recess, i.e., the second semiconductor layer remains in existence in this subarea so that, in the finished structure, the first semiconductor layer is buried beneath the second semiconductor layer in this area.

The protective layer is preferably removed within the further recess by applying and structuring a further mask layer and subsequent local etching. The structuring of the further mask layer may, in particular, take place by a lithographic process. In the process, the further mask layer is formed from photoresist and exposed in such a way that a subarea of the photoresist situated above the further recess may subsequently be dissolved, and the protective layer situated therebeneath is locally removed during subsequent etching.

According to one preferred specific embodiment of the present invention, the protective layer is formed from tetraethyl orthosilicate (TEOS) with the aid of low pressure chemical vapor deposition (LPCVD). As an alternative, it is also possible to use other materials, such as for example silicon nitride (SiN), aluminum nitride (AlN), or silicon oxide ($SiO_2$), which may be generated, in particular, by thermal oxidation.

According to one preferred specific embodiment of the present invention, the etching steps during the formation of the trench take place with the aid of plasma formed from sulfur hexafluoride ($SF_6$).

According to one preferred specific embodiment of the present invention, the mask layer is formed by a hard mask made up of tetraethyl orthosilicate (TEOS) applied with the aid of low pressure chemical vapor deposition (LPCVD). As an alternative, it is also possible to use other materials, such as silicon nitride (SiN), aluminum nitride (AlN), or oxides such as silicon oxide ($SiO_2$), or aluminum oxides ($Al_xO_y$).

The local etching of the protective layer preferably takes place with the aid of tetrafluoromethane $CF_4$, or with the aid of sulfur hexafluoride $SF_6$, in particular, with the aid of $SF_6$ ion bombardment.

According to one preferred specific embodiment of the present invention, it is provided that the etching of the second semiconductor layer is ended before the protective layer is etched through within the recess of the mask layer, it being recognized by end point detection that the protective layer has been reached or the number of etching cycles during the etching of the second semiconductor layer being established in such a way that the protective layer is not etched through within the recess of the mask layer. In the case of a through-etching of the protective layer, at least so much material of the protective layer is removed locally during etching that a perforation arises in the protective layer, and the first semiconductor layer situated therebeneath is exposed at this location. To avoid such a perforation, the number of etching cycles may be matched to the thickness of the second semiconductor layer in such a way that the protective layer is not etched through in any location. In the case of parallel processing of multiple subareas of the wafer, it must be noted in the process that this condition is met across the entire wafer, it being necessary to take tolerances and fluctuations of both the layer thickness and of the local etching rate into consideration. An etching process which is robust with respect to such deviations may be achieved via an appropriately selected thickness of the protective layer and the matching duration of the etching process.

The steps are preferably carried out simultaneously in multiple regions of a wafer and, in parallel, a multitude of microelectromechanical structures are generated, each of which includes at least one trench formed in the first semiconductor layer. The method according to the present invention is thus simultaneously applied in the various regions and, in a subsequent step, a multitude of corresponding components are obtained from the microelectromechanical structures generated by the parallel processing by dividing the wafer.

Exemplary embodiments of the present invention are shown in the figures and are described in greater detail in the following description.

DETAILED DESCRIPTION OF EXAMPLE EMBODIMENTS

Figure 1A:
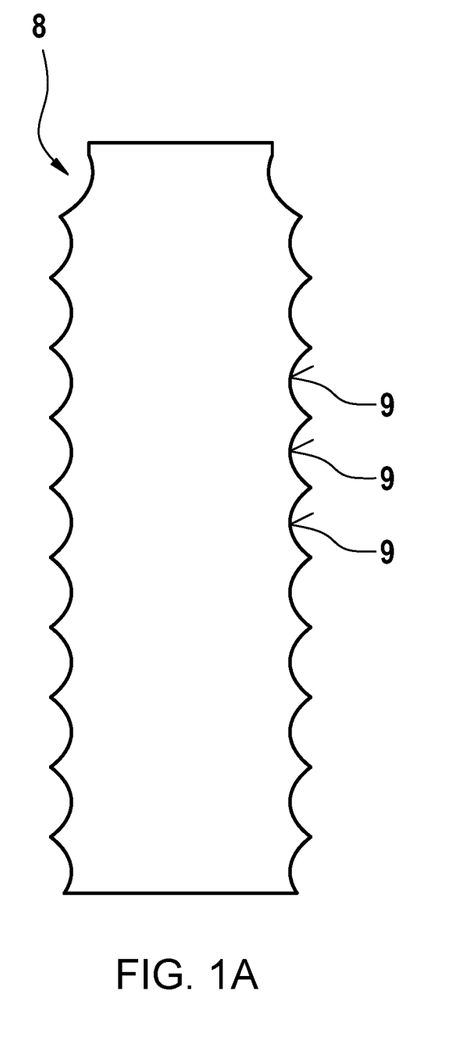
FIGS. 1A and 1B show a comparison of two trench profiles with and without overhang.
Figure 1B:
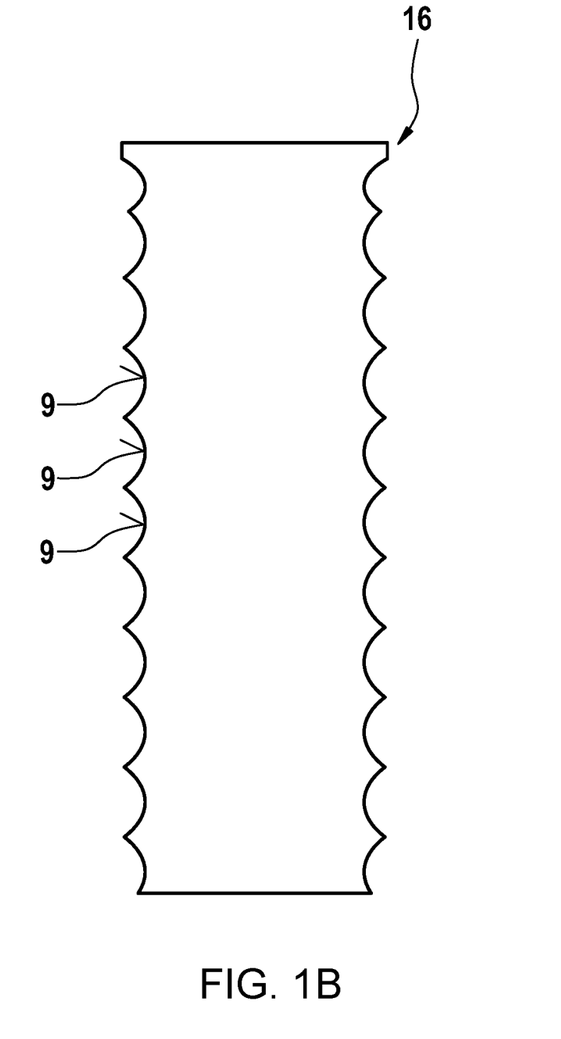

FIGS. 1A and 1B schematically illustrates two structures generated by trench etching using deep reactive ion etching (DRIE). The two structures may, for example, be deflectable masses of a microelectromechanical system. The vertically extending walls are formed by a cyclical alternation between etching and passivation steps, so that grooves 9 typical of this method arise at the trench wall. In the process, the width (i.e., the horizontal extension with respect to the drawing plane) of the trenches and of the generated structures is defined by an etching mask, which is removed after the trenches have been formed. As is shown to the right in FIG. 1B, a slightly lesser material removal takes place directly beneath the etching mask at the upper edge of the trench, so that an overhang 16 ("blade") remains there after the removal of the etching mask. This "blade" 16 may impinge on an adjoining structure and break off during a deflection of the movable mass or result in hooking. To avoid the overhang, an increased material removal 8 in the form of a pronounced "first groove," by which overhang 16 is prevented, may be generated by a prolonged first etching cycle at the beginning of the trench etching process.

FIGS. 2A-2F show a method for trench etching a buried semiconductor layer 1, by which the controlled formation of "first groove" 8 shown in FIG. 1A is made more difficult.

Figure 2A:
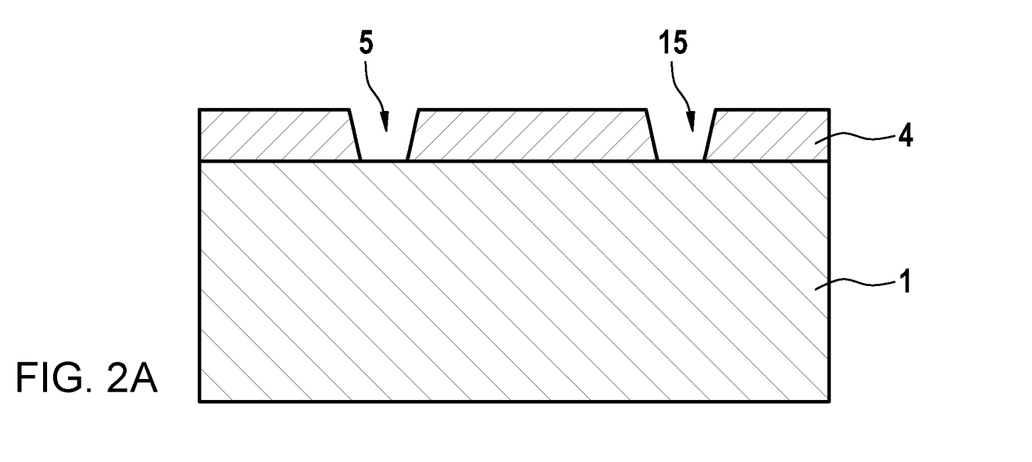
FIGS. 2A through 2F illustrate a problem underlying the present invention.
Figure 2B:
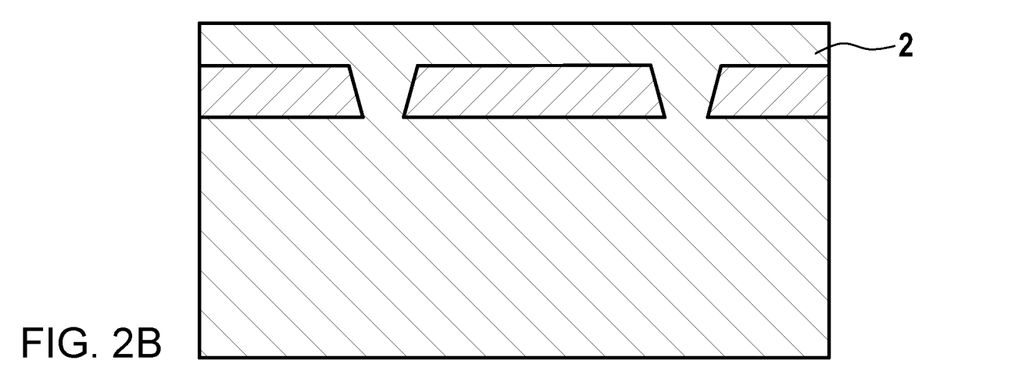
Figure 2C:
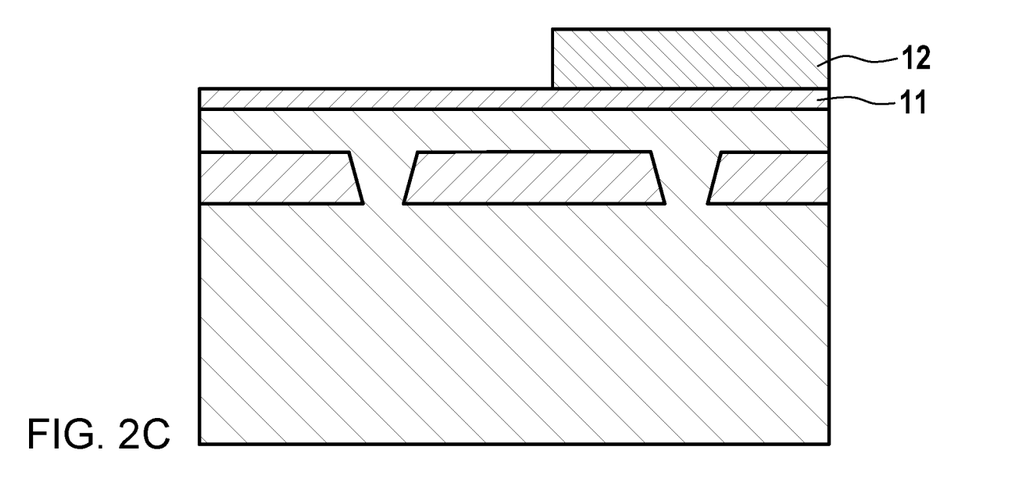
Figure 2D:
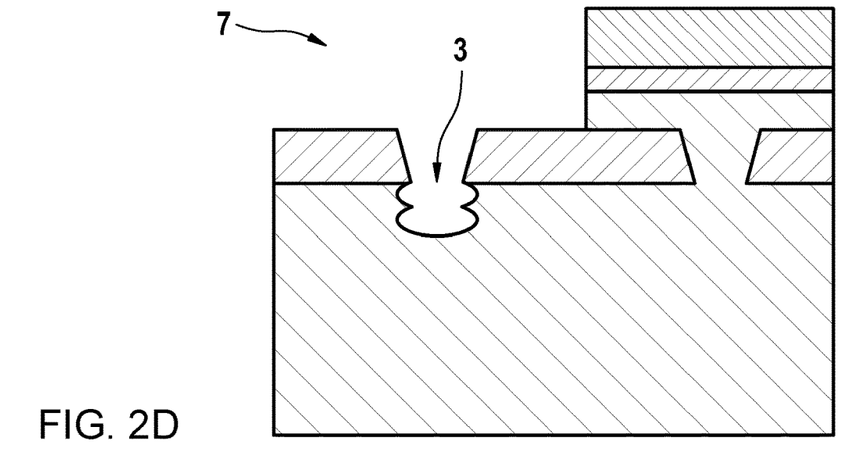
Figure 2E:
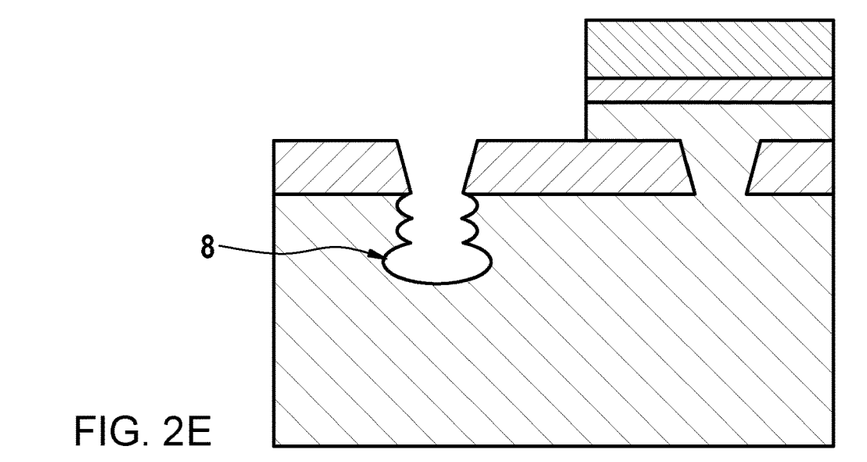
Figure 2F:
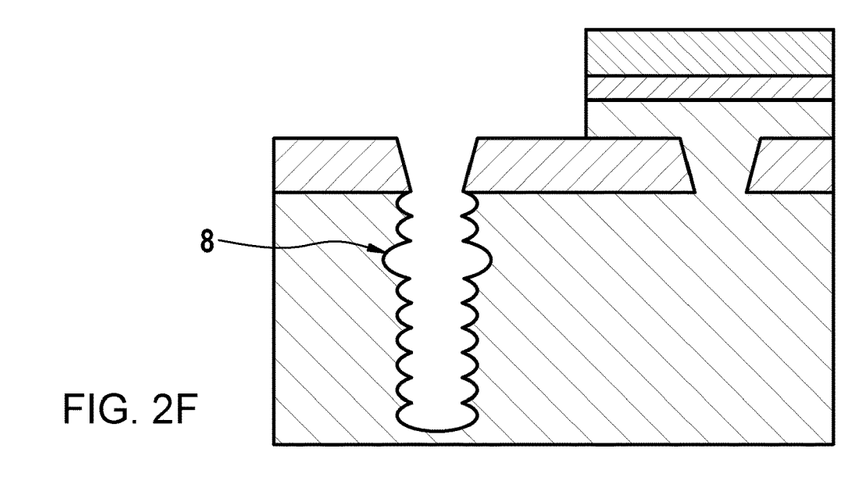

Initially, a mask layer 4 (hard mask, e.g., silicon oxide) is applied onto first semiconductor layer 1, as shown in FIG. 2A, and is provided with recesses 5, 15, of which first recess 5 serves as an etching mask for trenching processes taking place later. In the subsequent step, second semiconductor layer 2 shown in FIG. 2B is deposited onto mask layer 4, onto which subsequently further functional layers 11, 12 may be applied (FIG. 2C). In the etching process shown in FIGS. 2D, 2E, and 2F, layers 2, 11, 12 situated above mask layer 4 are removed in a subarea 7 encompassing recess 5, and a trench 3 is formed within the area of first semiconductor layer 1 defined by recess 5. Both the removal of subarea 7 of second semiconductor layer 2 and the trench etching of first semiconductor layer 1 take place consecutively as part of a continuous etching process. As a result of the fluctuations of the layer thicknesses and the local etching rates, the point in time at which the transition from the second to first semiconductor layer 2, 1 takes place cannot be exactly predetermined, so that the ideal point in time for forming "first groove" 8 cannot be exactly established. However, the positioning of "first groove" 8 is thus necessarily imprecise, so that overhang 16 at the upper edge of trench 3 (cf. FIG. 1B) cannot be reliably avoided.

Figure 3A:
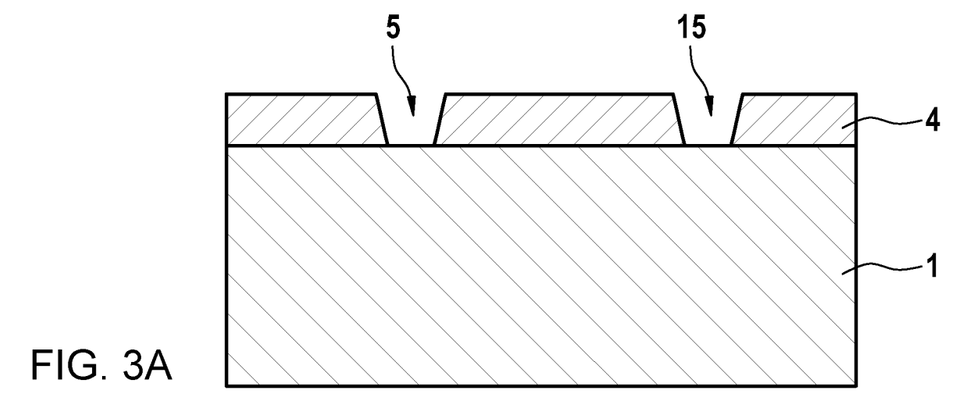
FIGS. 3A through 3G illustrate a method according to an example embodiment of the present invention.
Figure 3B:
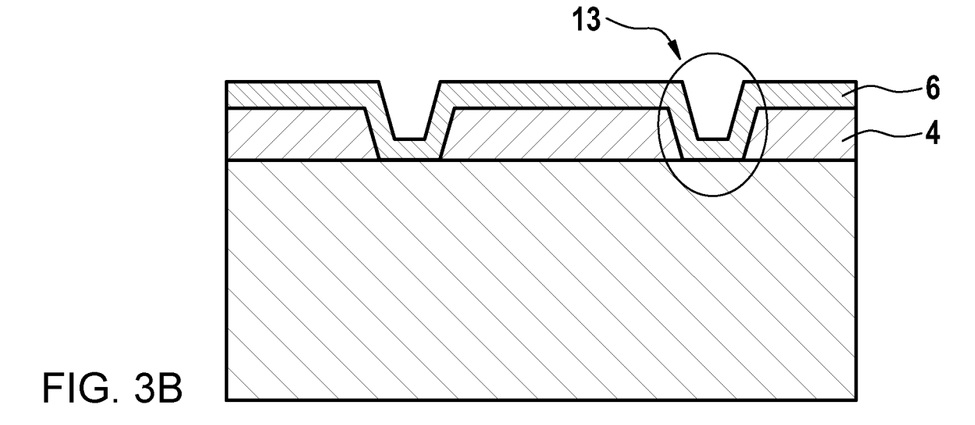
Figure 3C:
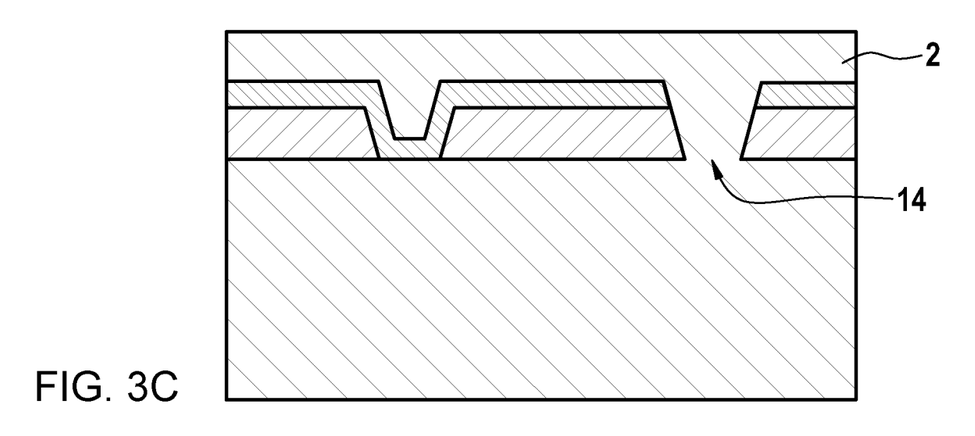
Figure 3D:
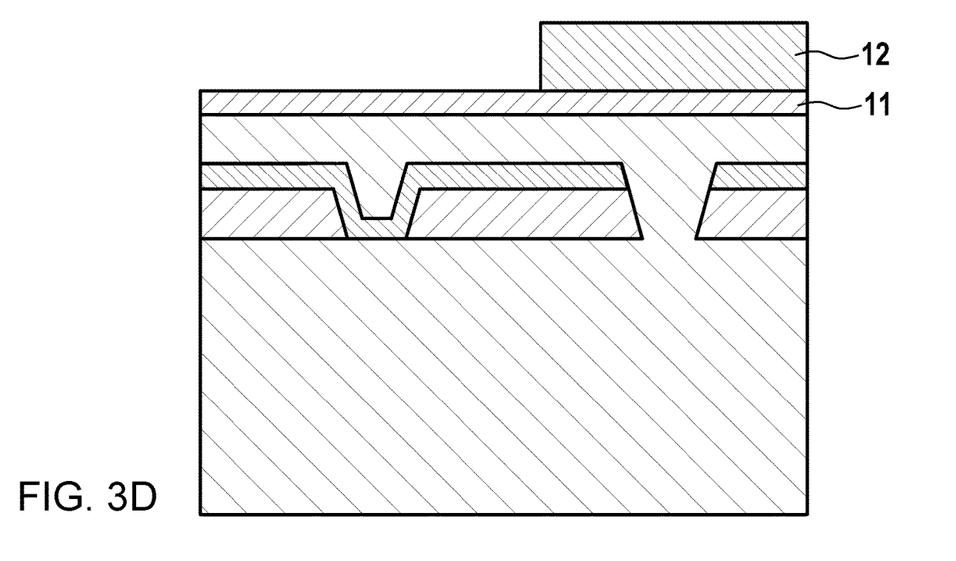
Figure 3E:
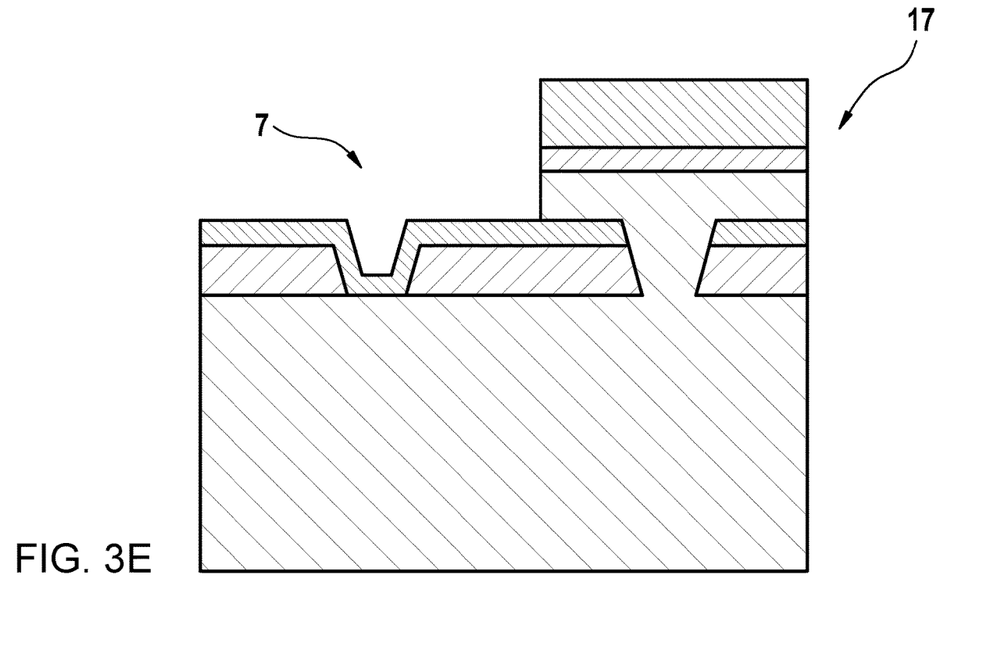

FIGS. 3A-3G show one specific embodiment of the method according to the present invention in which the problem illustrated in FIGS. 2A-2F is solved by the formation of an additional protective layer 6. The formation of mask layer 4, including recesses 5, 15, shown in FIG. 3A takes place similarly to FIG. 2A. Prior to the application of second semiconductor layer 2, however, a protective layer 6 (e.g., a TEOS layer deposited with the aid of LPCVD) is applied here, as shown in FIG. 3B, which at least slightly covers both the entire surface of mask layer 4 and the surfaces of first semiconductor layer 1 exposed within recesses 5, 15. First recess 5 again serves as an etching mask for the trench formation, while an electrical contacting of the first semiconductor layer or of the layers formed thereof is made possible by the second recess. However, for this contacting, the protective layer must initially be masked in area 13, for example by photolithography, and be locally removed prior to the application of second semiconductor layer 2. After the application of the second semiconductor layer (FIG. 3C), first and second semiconductor layers 1, 2 directly adjoin one another within recess 15, so that the desired electrically conducting contact is established. As shown in FIG. 3D, further functional layers 11, 12 may be applied onto second semiconductor layer 2, which thereafter are removed, together with second semiconductor layer 2, in a subarea 7 encompassing recess 5 by an SF6 trench (FIG. 3E). The remaining portion 17 is protected by a lacquer mask during etching and serves as a stand-off in the finished structure, i.e., may, in particular, be used to define the distance from a cap wafer applied onto the microelectromechanical structure or to contact the functional elements situated in the cap wafer, e.g., an application-specific integrated circuit (ASIC).

Figure 3F:
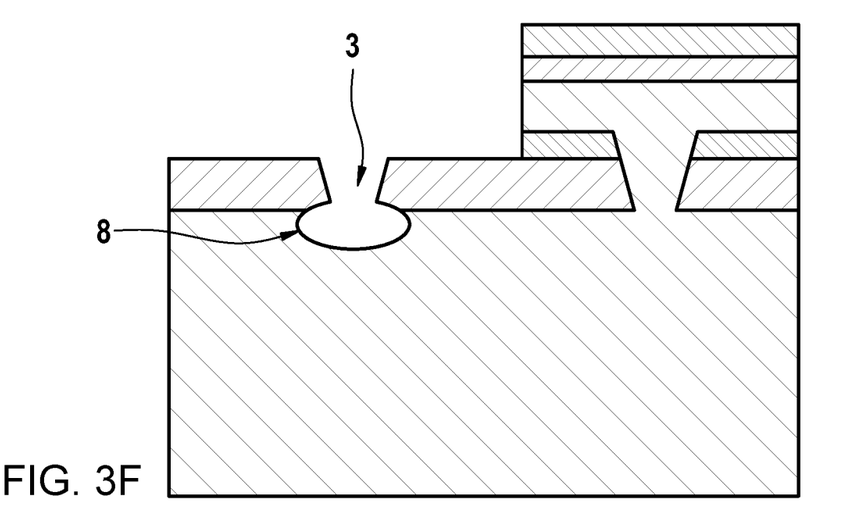
Figure 3G:
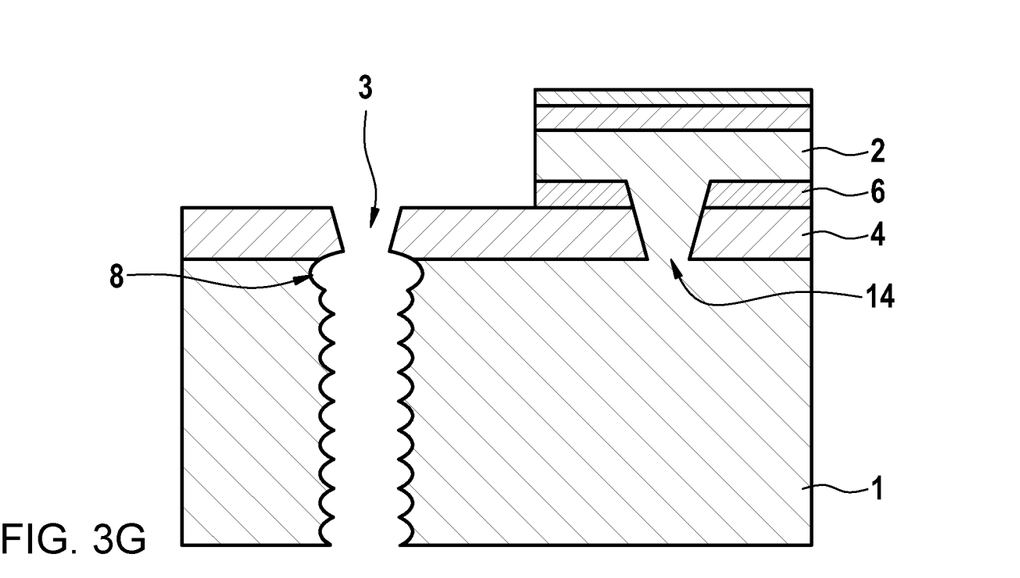

The applied protective layer 6 now allows the SF6 trench to be stopped in a defined manner (either by end point detection or by a preset etching cycle count) due to the selectivity change on protective layer 6 after the structuring of the stand-off. In the process, the variance of the etching rate across the wafer must be taken into consideration, i.e., the thickness of protective layer 6 must be selected in such a way that no perforation takes place yet locally, despite necessary over-etching. As shown in FIG. 3F, protective layer 6 is subsequently removed, so that a surface of first semiconductor layer 1 is exposed within recess 5. During the etching of the first semiconductor layer, "first groove" 8 may now be positioned relatively exactly directly beneath protective layer 6, so that in trench 3 shown in FIG. 3G no overhang remains at the upper edge. In the process, the method, in particular, allows the above-described steps to be carried out in parallel at multiple locations of the wafer, and thus a system made up of a plurality of identically designed electromechanical structures to be created, which are divided into separate components by dividing the wafer.

Figure 4A:
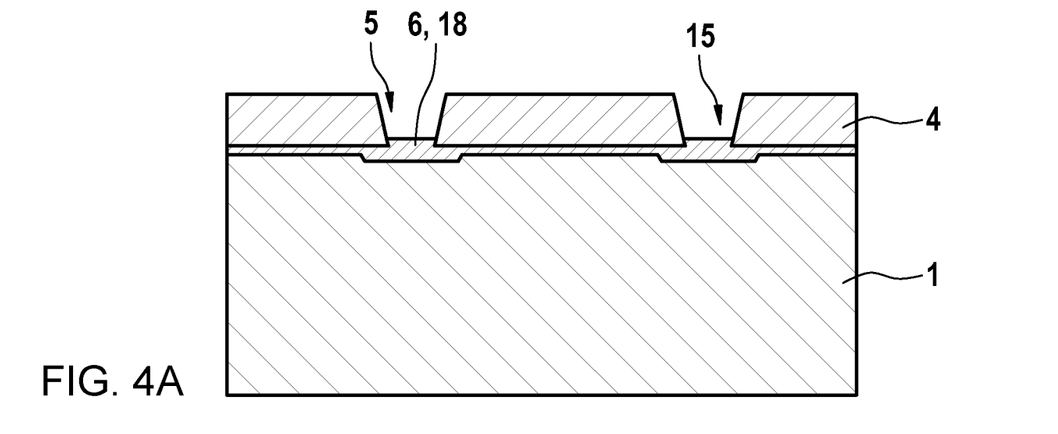
FIGS. 4A through 4E illustrate a variant of the method according to the present invention.
Figure 4B:
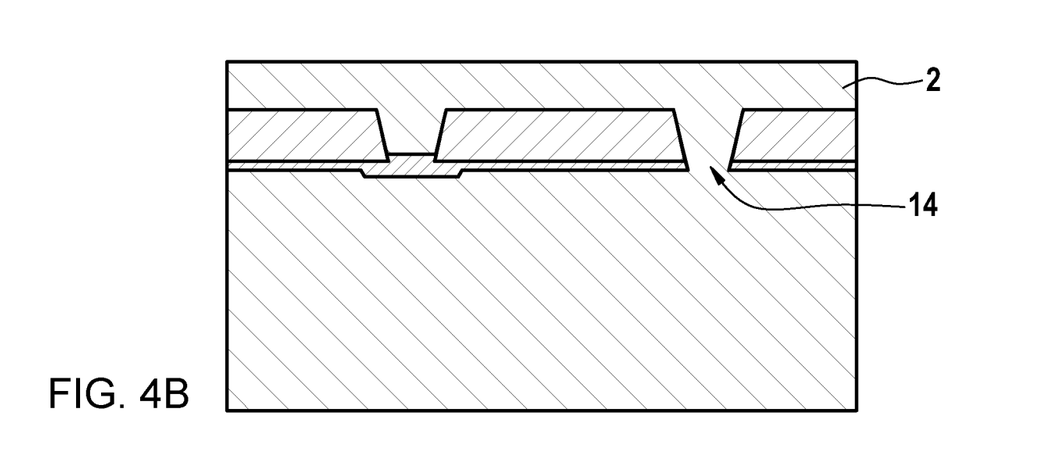
Figure 4C:
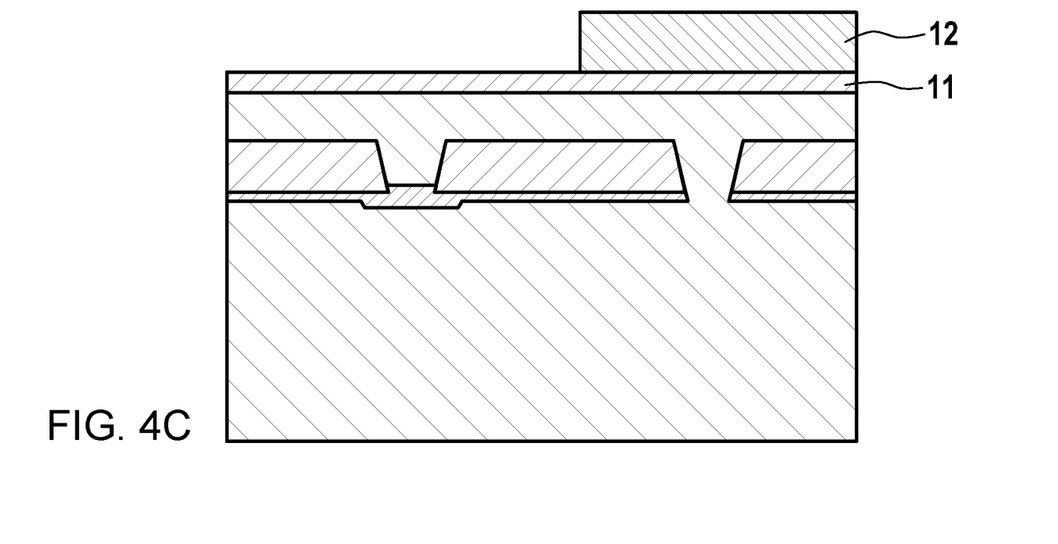
Figure 4D:
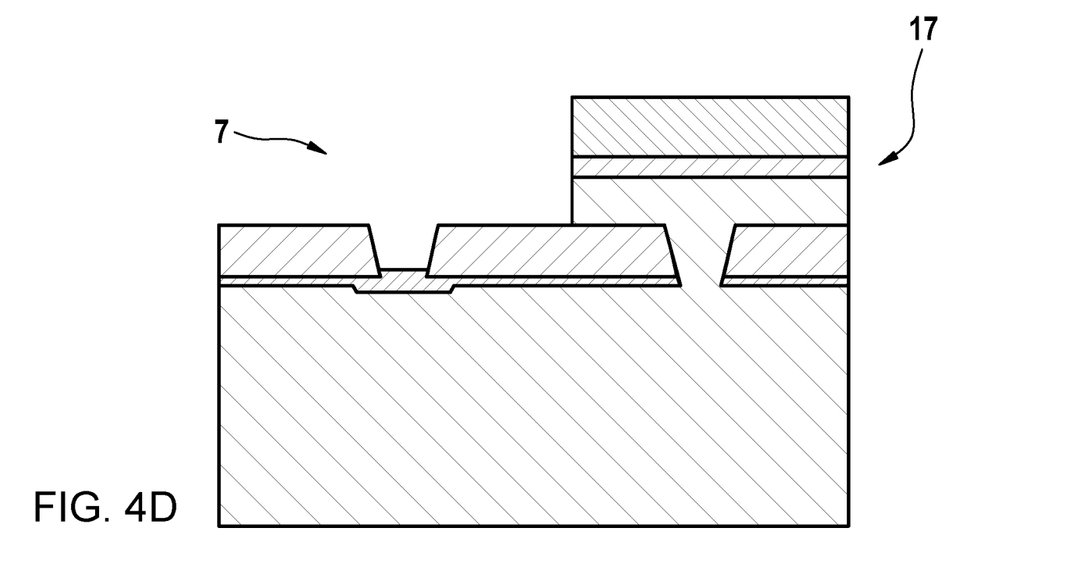
Figure 4E:
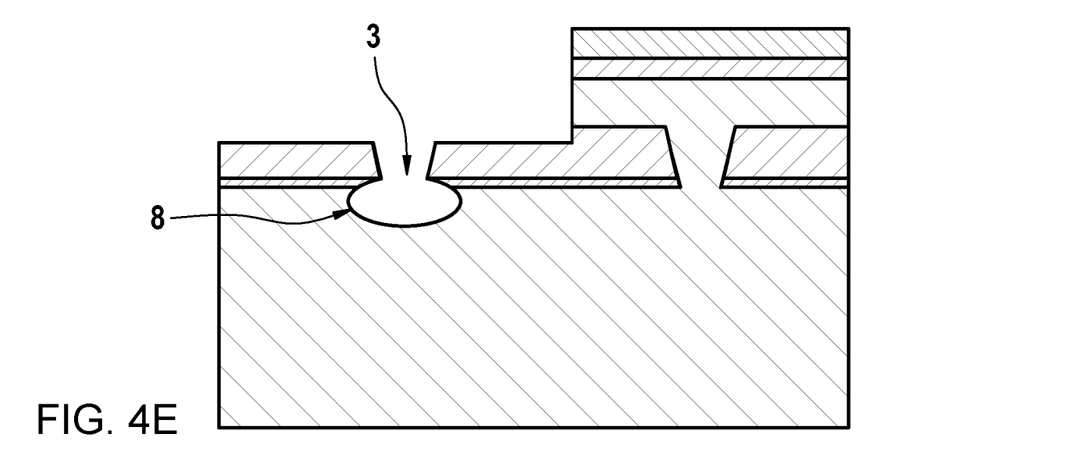

FIGS. 4A-4E show another specific embodiment of the method according to the present invention in which protective layer 6 is formed by a targeted oxidation of the surface of first semiconductor layer 1. The steps shown in FIGS. 4A through 4E replace the corresponding steps from FIGS. 3B through 3F, the details of the steps progressing similarly, except for the formation of oxide protective layer 6. Prior to the application of second semiconductor layer 2, here, as shown in FIG. 4A, the surfaces of first semiconductor layer 1 exposed in recesses 5, 15 of mask layer 4 are oxidized, so that oxidized portion 18 of the surface forms protective layer 6 needed for the method according to the present invention. First recess 5 again serves as an etching mask for the trench formation, while an electrical contacting of the first semiconductor layer 1 or of the structures formed thereof is made possible by second recess 15. However, for this contacting, oxide layer 18 must first be locally removed within recess 14 prior to the application of second semiconductor layer 2. After the application of second semiconductor layer 2 (FIG. 4A), the desired electrically conducting contact is then formed by recess 15. As shown in FIGS. 4C and 4D, further functional layers 11, 12 may be applied to second semiconductor layer 2, which thereafter, together with second semiconductor layer 2, in a subarea 7 encompassing recess 5, are removed by an SF6 trench. In the process, oxide layer 18 in recess 5 acts again as an etching stop, which, as shown in FIG. 4E, is subsequently removed so that trench 3 including first groove 8 may be formed.

What is claimed is:

1. A method for forming a trench in a first semiconductor layer of a multi-layer system, comprising the following steps:
   applying a mask layer onto the first semiconductor layer, at least one recess being formed in the mask layer in such a way that the first semiconductor layer is exposed within the recess;
   applying a protective layer, the protective layer completely covering or modifying the mask layer and the first semiconductor layer exposed within the recess;
   applying a second semiconductor layer onto the protective layer;
   etching the second semiconductor layer in such a way that the second semiconductor layer is completely removed in a subarea surrounding the recess of the mask layer, the protective layer acting as an etching stop, and the protective layer being exposed in the removed subarea;
   etching the protective layer in such a way that the first semiconductor layer is exposed within the recess; and
   forming the trench in the first semiconductor layer, the recess of the mask layer serving as an etching mask, and the trench being formed by a cyclical alternation between etching steps and passivation steps, material of the first semiconductor layer being successively removed by the etching steps, and a passivation of inner walls of the trench taking place by the passivation steps, and a first etching step of the etching steps being longer than subsequent etching steps of the etching steps so that a greater lateral material removal takes place at an upper edge of the trench than in areas situated beneath the upper edge.

2. The method as recited in claim 1, wherein, after the application of the mask layer, at least one further recess is formed in the mask layer, and the first semiconductor layer is exposed within the further recess, the protective layer being applied in such a way that it completely covers the first semiconductor layer exposed within the further recess, the protective layer being removed within the further recess prior to the application of the second semiconductor layer, so that the second semiconductor layer is in contact with the first semiconductor layer via the further recess.

3. The method as recited in claim 2, wherein a subarea of the second semiconductor layer surrounding the further recess of the mask layer is protected against material removal, by a lacquer coat, during the etching of the second semiconductor layer.

4. The method as recited in claim 2, wherein the protective layer is removed within the further recess by applying and structuring a further mask layer and subsequent local etching.

5. The method as recited in claim 1, wherein the protective layer is formed of tetraethyl orthosilicate (TEOS) using low pressure chemical vapor deposition (LPCVD).

6. The method as recited in claim 1, wherein the etching steps during the formation of the trench take place using a plasma formed from sulfur hexafluoride ($SF_6$).

7. The method as recited in claim 1, wherein the mask layer is formed by a hard mask made up of tetraethyl orthosilicate (TEOS) using low pressure chemical vapor deposition (LPCVD).

8. The method as recited in claim 1, wherein the local etching of the protective layer takes place with the aid of tetrafluoromethane ($CF_4$), or using sulfur hexafluoride ($SF_6$).

9. The method as recited in claim 1, wherein the etching of the second semiconductor layer is ended before the protective layer is etched through within the recess of the mask layer, it being recognized by end point detection that the protective layer has been reached or a number of etching cycles during the etching of the second semiconductor layer being established in such a way that the protective layer is not etched through within the recess of the mask layer.

10. The method as recited in claim 1, wherein the steps are carried out simultaneously in multiple regions of a wafer and, in parallel, a multitude of microelectromechanical structures are generated, each of which includes at least one trench formed in the first semiconductor layer.

* * * * *